United States Patent
Tan

(10) Patent No.: US 9,207,693 B1
(45) Date of Patent: Dec. 8, 2015

(54) METHOD AND APPARATUS FOR COMPENSATING PVT VARIATIONS

(71) Applicant: Infineon Technologies AG, Neubiberg (DE)

(72) Inventor: Hee Yeng Tan, Singapore (SG)

(73) Assignee: Infineon Technologies AG, Neubiberg (DE)

( * ) Notice: Subject to any disclaimer, the term of this patent is extended or adjusted under 35 U.S.C. 154(b) by 5 days.

(21) Appl. No.: 14/290,390

(22) Filed: May 29, 2014

(51) Int. Cl.
*H01L 35/00* (2006.01)
*G05F 1/46* (2006.01)

(52) U.S. Cl.
CPC ........................................ *G05F 1/463* (2013.01)

(58) Field of Classification Search
CPC ........... G06F 1/04; H03K 3/011; H03K 17/14
See application file for complete search history.

(56) References Cited

U.S. PATENT DOCUMENTS 7,719,371 B2 *   5/2010   Pernia et al. ..................... 331/78
2014/0177681 A1 *  6/2014   Chung et al. .................. 375/146

OTHER PUBLICATIONS

De Caro, et al., "A 1.27 GHz, All-Digital Spread Spectrum Clock Generator/Synthesizer in 65 nm CMOS," IEEE Journal of Solid-State Circuits, May 2010, pp. 1048-1060, vol. 45, No. 5, IEEE.

* cited by examiner

*Primary Examiner* — Jeffrey Zweizig
(74) *Attorney, Agent, or Firm* — Slater & Matsil, L.L.P.

(57) ABSTRACT

A method and device for compensating PVT (process, voltage temperature) variations are disclosed. In some embodiments an integrated circuit includes a buffer circuit and a PVT (process, temperature, voltage) compensation circuit configured to compensate a PVT variation of the buffer circuit, wherein the PVT compensation circuit includes adders and subtractors.

24 Claims, 5 Drawing Sheets

(1) a CLK_OUT edge can be generated by Delay-Line $\Delta_{RE}$
(2) a CLK_OUT edge can be generated by Delay-Line $\Delta_{FE}$

METHOD AND APPARATUS FOR COMPENSATING PVT VARIATIONS

TECHNICAL FIELD

The present invention relates generally to a device and method for compensating PVT (process, voltage, temperature) variations, and, in particular embodiments, to a device and method for compensating PVT variations in spread-spectrum clock generation (SSCG).

BACKGROUND

Spread-spectrum clock generator (SSCG) is used in synchronous digital systems in order to reduce spectral density of the electromagnetic interference (EMI). A synchronous digital system is one that is driven by a clock signal and, because of its periodic nature, has a narrow frequency spectrum. Spread-spectrum clocking reduces the peak radiated energy and electromagnetic emissions.

A SSCG generates a clock signal with a frequency that is intentionally swept (frequency modulated) within a certain frequency range, with a predefined modulation profile. Spread-spectrum clocking does not reduce the total power of the harmonic noise but it spreads the energy of each clock harmonic evenly over a dedicated bandwidth. In this way, the peak power level at each clock harmonic is reduced as much as 10-20 DB, depending on the modulation depth and the modulation profile.

A SSCG typically spreads energy over a larger bandwidth thereby effectively reduces electrical and magnetic readings within narrow bandwidths. Distributing this same energy into a larger bandwidth prevents systems from putting enough energy into any one narrowband to exceed the statutory limits.

However, spread-spectrum clocking, like other kinds of dynamic frequency changes, may create challenges such as clock/data misalignment or clock skew.

SUMMARY OF THE INVENTION

In accordance with embodiments of the present invention, an integrated circuit comprises a buffer circuit and a PVT (process, temperature, voltage) compensation circuit configured to compensate a PVT variation of the buffer circuit, wherein the PVT compensation circuit comprises adders and subtractors.

In accordance with embodiments of the present invention, a method for compensating a PVT (process, voltage, temperature) variation of a buffer circuit comprises calculating a plurality of PVT compensations values for the buffer circuit by applying an arithmetic subtraction calculation.

In accordance with embodiments of the present invention, a method for compensating a PVT (process, voltage, temperature) variation of a buffer circuit comprises calculating a plurality of PVT compensations values for the buffer circuit, and storing the PVT compensation values in a first look-up table.

In accordance with embodiments of the present invention, an integrated circuit comprises a buffer circuit and a PVT (process, temperature, voltage) compensation circuit comprising a first look-up table configured to store PVT compensation values.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

Figure 1:
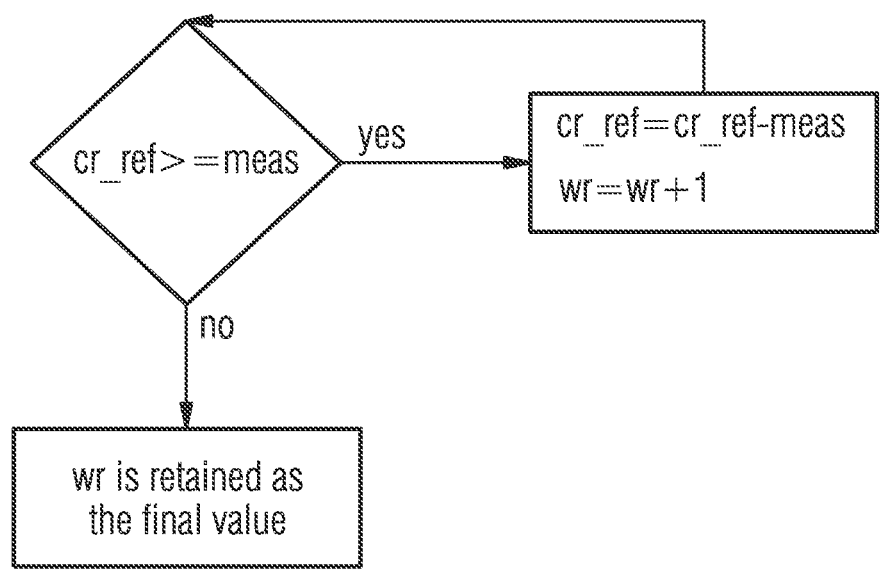
FIG. 1 is a flowchart of a method for calculating a PVT compensation value WR according to an arithmetic subtraction calculation.

A spread system clock generator (SSCG) (circuit, unit) shifts an input clock signal (e.g., by rising and/or falling edges) by a chain of buffer delay cells to provide a predetermined output clock signal. Such a shift from the input clock signal to the output clock signal may reduce the electromagnetic interference (EMI) energy. At the same time, the mean operating frequency may be maintained. PVT (Process, Voltage and Temperature) variations affect the buffer delay cells delay and the predetermined output clock signal's shifting manner. Therefore, a PVT compensation circuit is used to overcome and compensate for PVT variation.

Conventional PVT compensation circuits comprise analog feedback circuit such as PLL (phase locked loop) or digital divider circuit using digital arithmetic divider calculations. Conventional digital PVT compensation circuits typically include standard divider cells. Disadvantages of such conventional circuits are: 1) The compensation circuits may not be implemented in slower process technologies because it requires a long chain of digital combinational circuits to achieve the compensation within a single clock cycle, and 2) the conventional compensation circuits run continuously in real-time which prevent the implementation of a power saving mode.

Embodiments of the invention provide a PVT compensation circuit comprising register based look-up tables. Embodiments provide a PVT compensation circuit applying an arithmetic subtraction calculations. Some embodiments avoid divider circuits for formula calculations. Further embodiments include a method to stop calculating PVT compensation values when not required thereby reducing power consumption of the PVT compensation circuit.

Advantages of these embodiments are that these PVT compensation circuits can be applied to a wider range of process technologies (e.g., technologies 130 nm or smaller) than conventional PVT compensation circuits. Other advantages are that the PVT compensation circuit can be turned off periodically to save power. Since PVT does not change rapidly but rather slowly in real world settings or applications.

The PVT variations of delay buffer circuits in a SSCG are compensated with a PVT compensation circuit applying an arithmetic subtraction calculation (referred herein also as arithmetic subtraction calculation). The arithmetic subtraction calculation replaces or substitutes the conventional arithmetic division calculation (also referred herein as arithmetic division method, division method or division calculation). The arithmetic subtraction calculation may be used together with two sets of register-based memory tables.

The arithmetic subtraction calculation requires inevitably more calculation cycles to calculate the PVT compensation values than the division method. However, because two register based look-up tables are used to provide the PVT values to the delay buffer circuits (cells) the method is overall superior than the conventional division calculation. In particular, since the results according to the subtraction calculation are stored in look-up tables and then processed from one of the look-up tables the overall time for receiving a PVT compensation value is actually reduced compared to the conventional division method. After the PVT compensation values being calculated, they are stored in a first look-up table. The first look-up table stores the results (PVT compensation values) of the on-going PVT calculation. After the PVT compensation values for all buffer cells being calculated and stored in a first look-up table, they are copied to a second look-up table. In other words, the second look-up table may be refreshed only periodically with the current PVT compensation values stored in the first look-up table. The arithmetic subtraction method continuously calculates PVT compensation values and stores them in the first look-up table. After copying the PVT compensation values to the second look-up table, the stored compensation values are overwritten in the first look-up table and are replaced with newly calculated PVT compensation values. The buffer cells are compensated with the PVT compensation values stored in and accessed from the second look-up table.

In the SSCG, the finite state machine (FSM) and PVT compensation value calculation is implemented by the following formula:

$$wr = \frac{shift \cdot dcdl}{2^{12}} \cdot \frac{1}{meas}$$

wherein:
  "WR" is the compensation value (control value) submitted to the buffer delay cells in order to achieve the desired spread clock behavior (indicating the number of delay cells required to be activated to achieve the clock shifting needs for clock edges in real-time);
  "SHIFT" is a calculated value from the FSM based on the algorithm of a SSCG circuit. An example is disclosed in Davide de Caro et al., *A 1.27 GHz, All Digital Spread Spectrum Clock Generator/Synthesizer in 65 m CMOS*, IEEE Journal of Solid State Circuits, Vol. 45 (2010), 1048-1060. SHIFT (value) may be a range because it is based on the algorithm of a spread spectrum clock which in turn may be based on a range of different input clock frequencies.
  "DCDL" is a user input value based on the selected output clock signal frequency (such as 100 MHz or 300 MHz (or 150 MHz or 250 MHz) or any other desired MHz value between or outside these values) of the SSCG;
  "MEAS:" the PVT compensation circuit comprises a clock generation circuit with the same delay cells (e.g., in delay line 368 in FIG. 4) as the main delay (buffer) circuits (e.g., in delay lines 362, 364 in FIG. 4). For example, the PVT compensation circuit comprises a ring oscillator with the same delay cells as in the main delay cell circuit. A reference clock signal is used to calculate the delay of the clock signal running through the reference delay cells. The delayed clock running through the delay cells are further divided by a fixed value. The reference clock is then used to slice the divided delayed clock by X number of times to obtain the period of the delayed clock in the measured PVT condition ("Count" (value) means the number of times the reference clock slicing the delayed clock. Count is represented by MEAS). If the reference delay cells are slower, the count value is different than if the reference delay cells are faster. The larger the MEAS number the more often the reference clock has sliced the divided delayed clock and the slower the delay cells are behaving in the PVT condition.

SHIFT may change in every clock cycle. This may cause the formula and the division of MEAS to be required in every clock cycle for proper operation. Depending on the number of buffer delay cells used in the delay lines, the value SHIFT can be quite large.

The above formula can be rewritten as:

$$cr\_ref = (shift \times dcdl)/2^{12}$$

with $$wr = cr\_ref/meas$$

The division can be achieved with digital logic based subtractors rather than with digital logic based dividers. For example, cr_ref/meas can be represented by cr_ref-meas and by performing this operation x times. The total number of subtraction routines results in an integer and equals the division result. In this case the integer is represented by WR and the result of applying a logic operation (arithmetic subtraction calculation) as shown in the flowchart of FIG. 1.

Whenever a new result MEAS is obtained a look up table may be built based on the arithmetic subtraction method shown in FIG. 1. The PVT compensation value WR may a range because SHIFT may be a range.

Once the first table is built using many clock cycles, the first table is then transferred or copied to the second table. The first table is continuously refreshed with newly calculated values, while the second table is maintained with (quasi-)fix values transferred from the first table to the second table. The values of the second table may not change for some time. The values of the second table may only be updated or refreshed after a certain predetermined time. For example, the second table is refreshed when the first table is fully recalculated. For example, if the SSCG comprises 64 delay cells (in a delay line), the second table is refreshed after the 64 PVT (shift) compensation values are calculated. The second table comprises the PVT (shift) compensation values, and is configured to provide these values (output) to the delay cells. The first look-up table may take some time to be updated for all compensation values. However, the system will still be able to function in real time through the second look-up table. As explained above, the second look-up table is periodically updated via the first look-up table.

Figure 2:
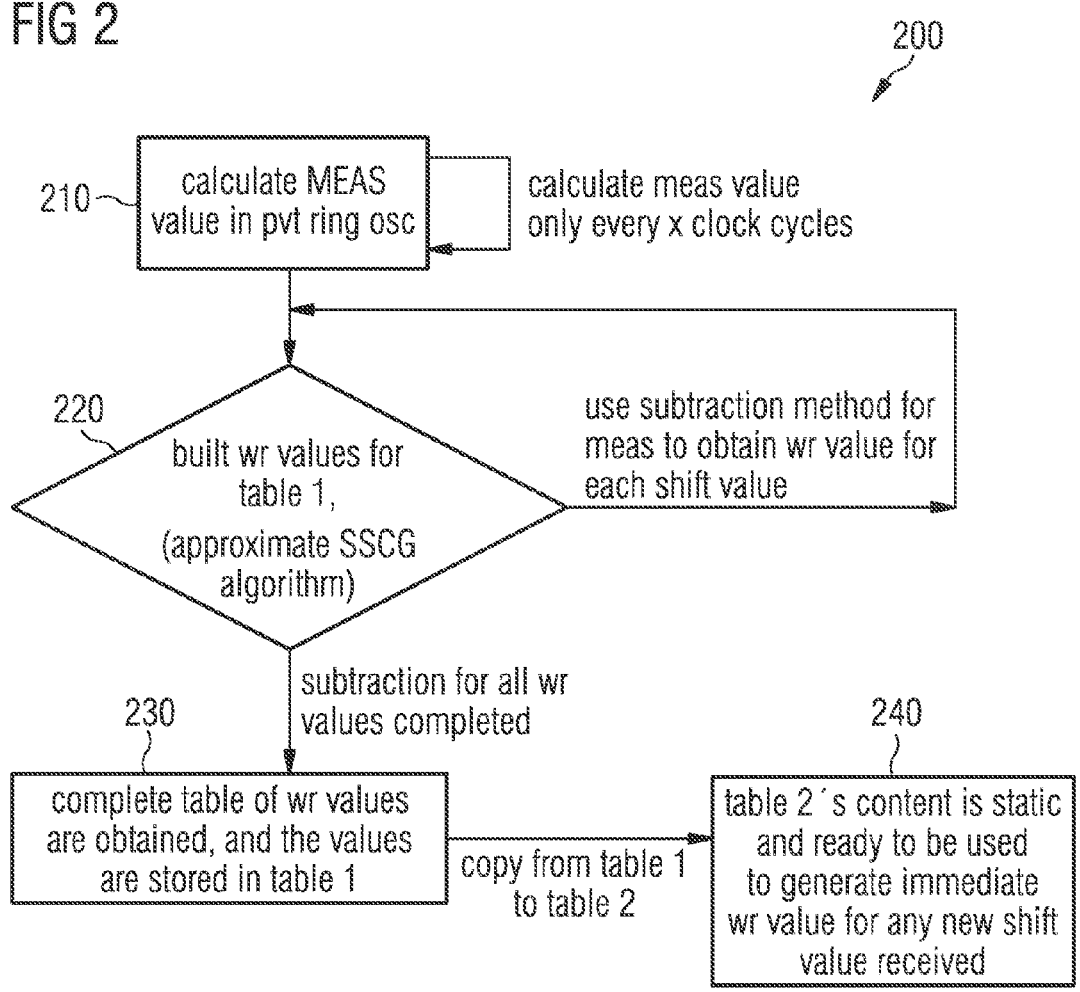
FIG. 2 is a flowchart of a method for calculating and storing PVT compensation values.

The full method 200 for calculating and storing the PVT compensation values is represented in the flowchart of FIG. 2. In a first step 210 a MEAS value is calculated for the clock generation circuit in the PVT compensation circuit. For example, a MEAS value is calculated for a ring oscillator of the PVT compensation circuit. The MEAS may be calculated for 1024 clock cycles since the empirical PVT values change slowly in a real world setting. Alternatively, the MEAS may be calculated for less than 1024 clock cycles (e.g., 512, 256, etc.) or for more than 1,024 clock cycles (e.g., 2048, 5096, etc.) In a next step 220 the PVT compensation values, WR (shift) values, are calculated. The WR values are calculated by applying arithmetic subtraction calculation for the calculated MEAS. A WR value may be obtained for each shift value or each buffer delay cell. By calculating the PVT compensation values the first look-up table is completed 230. If the SSCG comprises 64 buffer delay cells 64 WR (shift) values are calculated and stored in the first look-up table. The look-up table is complete or full if all 64 WR (shift) values are calculated and stored. If the SSCG comprises less than 64 delay cells (e.g., 32 delay cells) then 32 WR values are calculated and stored in the first look-up table. If there are more buffer delay cells (e.g., 128 delay cells) then more WR values are calculated to complete the first look-up table. In the last step 240, the first look-up table is copied to a second look-up table (e.g., the 64 WR values are copied over). The second look-up table's content may be (quasi) static (e.g., static for a certain amount of time) and ready to be used for the buffer delay cells. Namely, the values of the second look-up table are only refreshed after certain periods.

If there is no PVT compensation for some or all the delay cells, the WR values are still calculated and copied to both the look-up tables. The calculated values will base on a default which has been intentionally coded in the design to represent a nominal condition scenario (room temperature, standard voltage, and standard process corner).

The size of the look-up tables (e.g., register size) may be fixed depending on the number of the buffer delay cells. For example, if 64 sets of N-bit registers are used in each table, the first table will be constantly updated by the latest calculated values for the PVT compensation (shift) values WR. Once the first table has reaches its full register size, the full register is copied to the second table. The PVT compensation values from the second look-up table are used to control the buffer delay lines.

The system may be able to function in real-time through the second table while the first table is updated.

In some embodiments a power saving function may be implemented. For example, the PVT calculation does not take place for a certain amount of time (turned off and then turned on) or operates only every 1,000, 10,000 or 100,000 clock circles.

Figure 3:
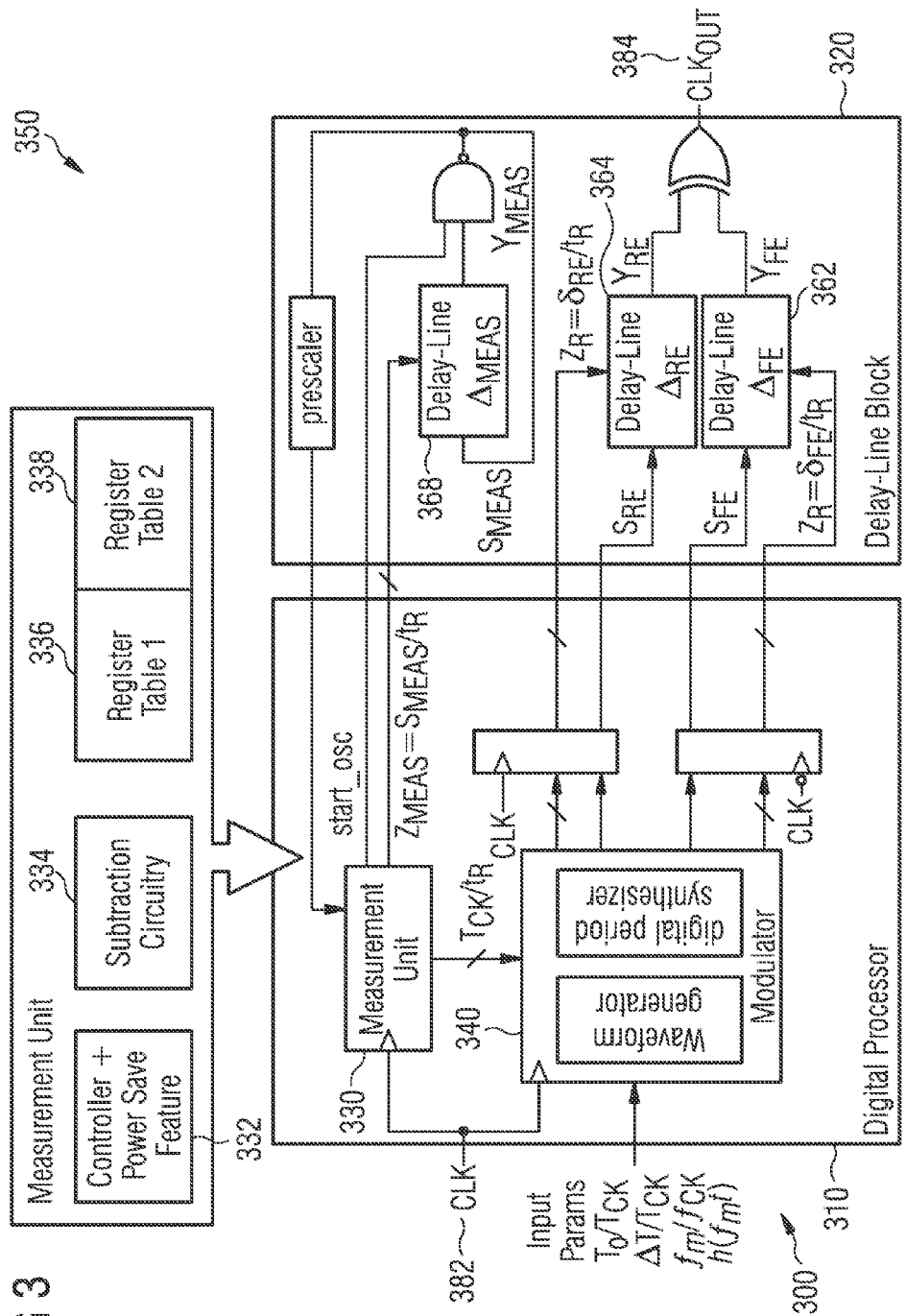
FIG. 3 is a block diagram of an SSCG circuit according to an embodiment of the invention.

FIG. 3 shows a block diagram according to an embodiment of the invention. The block diagram shows an implementation of a Spread System Clock Generator (SSCG) 300. The SSCG 300 comprises a digital processor unit 310 and a delay line unit 320. The digital processor unit 310 comprises a measurement unit 330 and a modulator 340, wherein the modulator 340 comprises a waveform generator and digital period synthesizer. The waveform generator may generate waves with triangular waveform. However, the waveform generator may generate any other suitable waves such as sine waveform or a rectangular waveform. The measurement unit 330 is configured to measure and calculate compensation of the PVT variation. The delay line unit 320 includes the buffer delay cells in delay lines 362, 364. In this example, SSCG 300 comprises two delay lines 362, 364, wherein the phase is shifted between the first delay line 362 and the second delay line 364 by half a clock cycle.

The SSCG 300 is configured to provide a certain output clock frequency. For example, the selected output clock frequency can be 100 MHz or 300 MHz (or 150 MHz or 250 MHz) or any other desired MHz frequency. To achieve the different output clock frequencies, the SSCG 300 is configured to turn on and off delay frequency cells. The delay line unit 320 can be digitally controlled to set the number of turned on buffer delay cells. The number of buffer delay cells (located in both the delay lines) to be turned on, may be based on the final calculated PVT compensation value after the calculation is completed through the measurement unit 330. In some embodiments the SSCG 300 uses the method to calculate the final calculated PVT compensation value described with respect to FIGS. 1 and 2.

For example, if the final calculated PVT compensation value is 50, then 50 buffer delay cells in each delay line 362, 364 are turned on out of the total of 64 delay cells in each delay line 362, 364 of the SSCG 300. The period (and therefore the characteristic) of the output clock signal can be changed by changing the number of buffer delay cells to be turned on.

The SSCG 300 comprises the PVT compensation circuit 350. The PVT compensation circuit comprises circuit elements of the digital processor unit 310 and of the delay line unit 320. The PVT compensation circuit 350 comprises the measurement unit 330, a delay line 368, and a prescaler 370. The measurement unit 330 may comprise a power save (power off) circuit 332, a subtraction circuit 334, a first register table 336 and a second register table 338. The delay line 368 is employed in the PVT compensation circuit 350 to track process, voltage and temperature variations.

Figure 4:
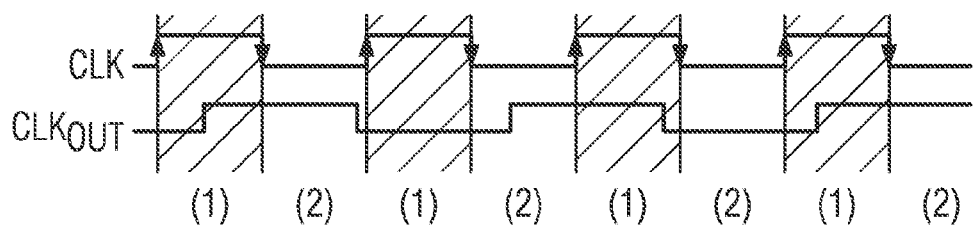
FIG. 4 is an exemplary clock delay.

The SSCG 300 has an input terminal 382 and an output terminal 384. The input terminal 382 receives an input signal (e.g., clock signal CLK) and the output terminal 344 provides and transmits an output signal (e.g., clock signal $CLK_{OUT}$). $CLK_{OUT}$ edges can be generated by the different delay lines 362, 364. For example, the clock output signal can be delayed by $\Delta_{RE}$ or by $\Delta_{FE}$. An example of a delay between an input clock signal and an output clock signal is shown in FIG. 4.

The look-up tables 336, 338 may be located in the measurement unit 330 of the digital processor. The two look-up tables may be register based look-up tables located inside the processor. Alternatively, the look-up tables may be located outside of the digital processor in separate memory devices. The look-up tables are two look-up tables. Alternatively, there are more than two look-up tables. For example, there are four, six, eight or more look-up tables. Each look-up table may have the size of 64×7=448 registers. The number of registers may cater to the frequency range in which the SSCG is supposed to work. 64 is the number of arrays for a complete PVT compensation and to cover the full range of delay variations for all buffers. 7 is the number of bits for the control value WR. These numbers can be different. For example, the array may be 32 or 16, or alternatively, 128, 256, 512, or 1024. Alternatively, the array can comprise a different size. Similarly, the control value WR may comprise more or less than 7 bits. Each register can be represented by 1 flip-flop.

The PVT compensation circuit 350 comprises a power off circuit. It is not necessary to obtain the MEAS value for every clock cycle since PVT changes very slowly in a real world scenario. For example, the MEAS value can be obtained every 1,000 k cycles or every 100 k cycles. When the MEAS value is not updated, the PVT compensation circuit 350 (in particular the subtraction circuitry 334) can be turned off to save power.

The design can be easily implemented in VHDL and cater for wide range of process technologies. The advantage of embodiments of the invention is to provide a design of a PVT compensation circuit for slow process technologies.

Figure 5:
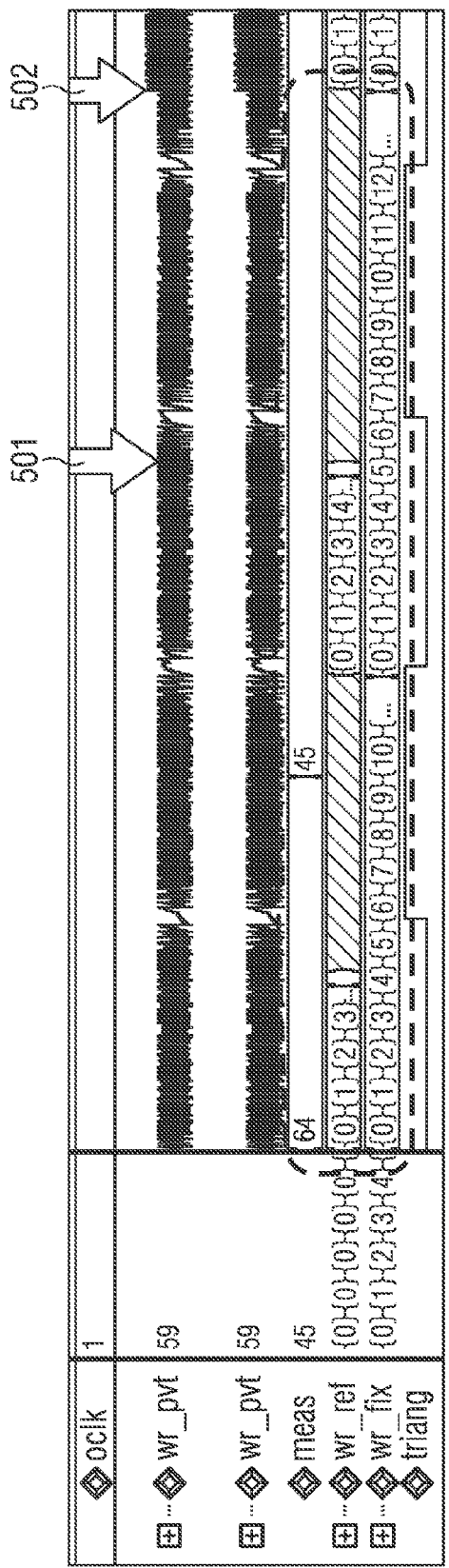
FIG. 5 shows a waveform of an embodiment of a PVT compensation circuit with register-based look-up tables.

FIG. 5 shows the waveform of the implemented PVT compensation circuit a with register based look-up table mechanism.

In the diagram: wr_ref represents WR from the first look-up table, wr_fix represents WR from the second look-up table, and wr_pvt and wf_pvt shows the final compensated PVT values used to control the amount of buffers to be turned on/off in the delay cells of the delay lines.

The delay cells delay value may be intentionally forced to a smaller value (thus a faster delay). This caused the MEAS value (the count value of reference clock slicing the divided delayed clock) to change from 64 to 45, for example. The lesser count means the period of the delayed clock is smaller, thus meaning a faster delay in the delay cell. With the change in the MEAS, the PVT compensation circuitry may start to work. It triggers calculating and refreshing of the PVT values in the first look-up table wr_ref at the first arrow 501. The initial wr_ref calculation is based on MEAS 64 (before first arrow 501). The calculation may be completed before the next calculation of the PVT values starts. After the calculation of the wr_ref (MEAS=45) is completed the values are copied into the second look-up table wr_fix. The copying takes place at the second arrow 502.

Once wr_fix are updated to the latest value, wr_pvt and wf_pvt are recalculated. Wr_fix is the final WR value for the amount of buffer cells to be turn on. In this particular embodiment wr_pvt is the buffer delay value for the rising edge of the output clock, and wf_pvt is the buffer delay value for the falling edge of the output clock. Essentially these two values (wr_pvt and wf_pvt) use the same number of delay cells (taken from wr_fix), but half a period time shifted, and they are used to control the rising and falling stage of the clock independently. The final SSCG output clock is re-constructed by combining both the rising edge of the delayed clock and the falling edge of the delayed clock. The change of value of 'wr_pvt' and 'wf_pvt' represents that the new PVT calculated value is obtained based on the change of MEAS value.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. An integrated circuit comprising:
a buffer circuit; and
a PVT (process, temperature, voltage) compensation circuit configured to compensate a PVT variation of the buffer circuit, wherein the PVT compensation circuit comprises adders and subtractors.

2. The integrated circuit according to claim 1, wherein the PVT compensation circuit further comprises a first look-up table and a second look-up table.

3. The integrated circuit according to claim 2, wherein the first and second look-up tables are first and second register based look-up tables.

4. The integrated circuit according to claim 1, wherein the PVT compensation circuit does not include dividers.

5. The integrated circuit according to claim 1, wherein the integrated circuit is a Spread Spectrum Clock Generator (SSCG).

6. The integrated circuit according to claim 1, wherein the PVT compensation circuit comprises the same number of buffer cells than the buffer circuit.

7. The integrated circuit according to claim 1, wherein the PVT compensation circuit comprises a power off circuit.

8. A method for compensating a PVT (process, voltage, temperature) variation of a buffer circuit, the method comprising:
calculating a plurality of PVT compensations values for the buffer circuit by applying an arithmetic subtraction calculation.

9. The method according to claim 8, further comprising storing the PVT compensation values in a first look-up table and copying the PVT compensation values from the first look-up table to a second look-up table.

10. The method according to claim 9, wherein storing the PVT compensation values in the first look-up table comprises constantly updating the first look-up table with the PVT compensation values, and wherein copying the PVT compensation values from the first look-up table to the second look-up table comprises copying the PVT compensation values in time intervals.

11. The method according to claim 8, wherein calculating the PVT compensation values comprises not applying an arithmetic division calculation.

12. The method according to claim 8, wherein calculating the PVT compensation values comprises turning off calculating the PVT compensation values periodically.

13. A method for compensating a PVT (process, voltage, temperature) variation of a buffer circuit, the method comprising:
calculating a plurality of PVT compensations values for the buffer circuit; and
storing the PVT compensation values in a first look-up table.

14. The method according to claim 13, further comprising copying the PVT compensation values from the first look-up table to a second look-up table.

15. The method according to claim 14, wherein storing the PVT compensation values in the first look-up table comprises constantly updating the first look-up table with the PVT compensation values, and wherein copying the PVT compensation values from the first look-up table to the second look-up table comprises copying the PVT compensation values in time intervals.

16. The method according to claim 15, wherein the PVT compensation values are copied when the first look-up table is fully calculated.

17. The method according to claim 13, wherein calculating the PVT compensation values comprises applying an arithmetic subtraction calculation.

18. The method according to claim 13, wherein calculating the PVT compensation values comprises not applying a division calculation.

19. The method according to claim 14, wherein calculating the PVT compensation values comprises turning off calculating the PVT compensation values periodically.

20. An integrated circuit comprising:
a buffer circuit; and
a PVT (process, temperature, voltage) compensation circuit comprising a first look-up table configured to store PVT compensation values.

21. The integrated circuit according to claim 20, wherein the PVT compensation circuit further comprises a second look-up table configured to store the PVT compensation values.

22. The integrated circuit according to claim 20, wherein the PVT compensation circuit is configured to calculated the PVT compensation values according to an arithmetic subtraction calculation.

23. The integrated circuit according to claim 20, wherein the PVT compensation circuit is not configured to calculate the PVT compensation values according to a division calculation.

24. The integrated circuit according to claim 20, wherein the PVT compensation circuit comprises a power off circuit.

* * * * *